United States Patent
Cho et al.

(10) Patent No.: US 9,667,236 B1
(45) Date of Patent: May 30, 2017

(54) PHASE INTERPOLATOR WITH IMPROVED LINEARITY AT QUADRANT BOUNDARIES

(71) Applicant: Xilinx, Inc., San Jose, CA (US)

(72) Inventors: Junho Cho, Cupertino, CA (US); Jinyung Namkoong, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/011,012

(22) Filed: Jan. 29, 2016

(51) Int. Cl.
*H03H 11/16* (2006.01)
*H03K 5/13* (2014.01)
*H03M 1/74* (2006.01)
*H03K 5/00* (2006.01)

(52) U.S. Cl.
CPC .............. *H03K 5/13* (2013.01); *H03M 1/742* (2013.01); *H03K 2005/00052* (2013.01)

(58) Field of Classification Search
CPC ......... H03K 19/0013; H03K 19/09441; H03K 19/017545; H03K 5/13
USPC ....... 327/238, 141, 231, 256, 257, 157, 161, 327/403, 404, 108–112; 341/144, 136, 341/153
See application file for complete search history.

(56) References Cited

U.S. PATENT DOCUMENTS

| 5,257,027 A | * | 10/1993 | Murota | H03M 1/808 341/144 |
| 7,423,469 B2 | * | 9/2008 | Pickering | H03K 5/13 327/231 |
| 8,184,029 B1 | * | 5/2012 | Hsieh | H03K 19/177 327/231 |
| 8,253,451 B1 | * | 8/2012 | Hsieh | H03L 7/0807 327/141 |
| 9,000,812 B1 | * | 4/2015 | Lowney | H03K 17/162 327/108 |
| 2008/0164928 A1 | * | 7/2008 | Rausch | H03H 11/20 327/258 |
| 2010/0085229 A1 | * | 4/2010 | Nam | H03M 1/162 341/155 |
| 2016/0254813 A1 | * | 9/2016 | Cho | H03K 19/0013 326/115 |

* cited by examiner

*Primary Examiner* — Lincoln Donovan
*Assistant Examiner* — Thomas Skibinski
(74) *Attorney, Agent, or Firm* — Gerald Chan

(57) ABSTRACT

A phase interpolator includes: a digital-to-analog converter to generate bias signals associated with phase signals; a multiplexer having an input interface and an output interface, wherein the digital-to-analog converter is coupled to the input interface of the multiplexer; a first current source; and a second current source; wherein the digital-to-analog converter is configured to provide bleeder current signals to the first current source and the second current source while bypassing the multiplexer.

20 Claims, 7 Drawing Sheets

PHASE INTERPOLATOR WITH IMPROVED LINEARITY AT QUADRANT BOUNDARIES

FIELD

An embodiment described herein relates to integrated circuit devices ("ICs"). More particularly, an embodiment described herein relates to a phase interpolator with improved linearity.

BACKGROUND

Programmable logic devices ("PLDs") are a type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile may include both programmable interconnect and programmable logic. The programmable interconnect may include a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic may be programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices.

In CPLDs, configuration data may be stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs may be programmed by applying a processing layer, such as a metal layer, that programmably interconnects the various elements on the device. These PLDs are known as mask programmable devices. PLDs may also be implemented in other ways, e.g., using fuse or anti-fuse technology. The terms "PLD" and "programmable logic device" include but are not limited to these exemplary devices, as well as encompassing devices that are only partially programmable. For example, one type of PLD includes a combination of hardcoded transistor logic and a programmable switch fabric that programmably interconnects the hard-coded transistor logic.

PLDs may be used to implement phase interpolators, which can be used to make adjustments to a sampling clock signal. Generally, phase interpolators work by shifting the phase of a sampling clock signal so that it aligns with a received/target clock signal. This allows received data to be sampled at the correct times and/or rates. In some implementations, phase interpolators may operate current mode logic ("CML"), which uses a differential signal to interpolate the sampling clock between two phase angles (e.g., between 0 and 90 degrees).

In current mode logic ("CML"), device mismatch between different components, such as transistors, may cause poor statistical differential non-linearity ("DNL") at quadrant boundaries when switching from one phase range to another. Accordingly, it may be desirable and useful to improve the statistical DNL at the quadrant boundaries for these types of implementations.

SUMMARY

One or more embodiments generally related to a phase interpolator with improved statistical DNL at quadrant boundaries. An embodiment relates to a phase interpolator having a digital-to-analog converter (DAC) that generates voltage bias signals that may be input into a pass gate, such as a multiplexer. The multiplexer may comprise one or more switches that may output control current voltages to one or more current sources. The DAC may also generate and provide bleeder currents to the one or more current sources, while bypassing the pass gate. The bleeder currents may keep the transistors in the non-active current sources in a low, but non-zero current state.

A phase interpolator includes: a digital-to-analog converter to generate bias signals associated with phase signals; a multiplexer having an input interface and an output interface, wherein the digital-to-analog converter is coupled to the input interface of the multiplexer; a first current source; and a second current source; wherein the digital-to-analog converter is configured to provide bleeder current signals to the first current source and the second current source while bypassing the multiplexer.

Optionally, the first current source and the second current source are coupled to the output interface of the multiplexer to receive control current source voltages.

Optionally, the first current source includes: a first transistor having first source/drain nodes coupled to the output interface of the multiplexer; and a second transistor having a gate coupled to the source/drain node of the first transistor.

Optionally, the first transistor and the second transistor form a fixed transistor pair.

Optionally, the second transistor has a first source/drain node that is coupled to ground.

Optionally, the second transistor has a second source/drain node that is coupled to a current source node.

Optionally, the phase signals comprise a first range of phases, and a second range of phases, wherein the first range of phases and the second range of phases are non-overlapping.

Optionally, the first current source is associated with the first range of phases and the second current source is associated with the second range of phases.

Optionally, the first current source and the second current source are configured to receive respective outputs from the output interface of the multiplexer and to receive the bleeder current signals when the first current source and the second current source are active, and wherein the first current source and the second current source are configured to receive the bleeder current signals without the outputs from the output interface of the multiplexer when the first current source and the second current source are inactive.

Optionally, the phase interpolator further includes: a third current source; and a fourth current source; wherein the digital-to-analog converter is coupled to the third current source and the fourth current source.

Optionally, the multiplexer comprises: a first switch that corresponds to a first set of phases that covers 0 to 90 degrees semi-inclusive, a second switch that corresponds to a second set of phases that covers 90 and 180 degrees semi-inclusive, a third switch the corresponds to a third set of phases that covers 180 and 270 degrees semi-inclusive, and a fourth switch that corresponds to a fourth set of phases that covers 270 and 360 degrees semi-inclusive.

Optionally, first current source and the second current source are configured to interpolate a phase angle in the first set of phases, the second current source and the third current source are configured to interpolate a phase angle in the second set of phases, wherein the third current source and the fourth current source are configured to interpolate a phase angle in the third set of phases, and wherein the first current source and the fourth current source are configured to interpolate a phase angle in the fourth set of phases.

Optionally, the first current source, the second current source, the third current source, and the fourth current source have respective fixed transistor pairs.

Optionally, one of the bleeder currents is for keeping a transistor in the first current source in a non-zero current state.

A method for phase interpolation includes: receiving, at a first current source and a second current source, respective control current source voltages, the control voltage signals being output by a multiplexer in response to bias voltage signals; receiving, at the first current source and the second current source, respective first and second bleeder current signals that bypass the multiplexer; and generating a differential signal that corresponds to a phase angle to be interpolated, the differential signal comprising a first output voltage signal from the first current source and a second output voltage signal from the second current source.

Optionally, the method further includes receiving, at a third current source and a fourth current source, respective third and fourth bleeder current signals that bypass the multiplexer.

Optionally, when the multiplexer outputs the control voltage signals for the first and second current sources, the multiplexer does not output any control voltage signals for the third and fourth current sources.

Optionally, when the multiplexer outputs control voltage signals for the second and third current sources, the multiplexer does not output any control voltage signals for the first and fourth current sources; wherein when the multiplexer outputs the control voltage signals for the third and fourth current sources, the multiplexer does not output any control voltage signals for the first and second current sources; and wherein when the multiplexer outputs the control voltage signals for the first and fourth current sources, the multiplexer does not output any control voltage signals for the second and third current sources.

Optionally, only two of the first, second, third, and fourth current sources are active at a time to provide phase angle interpolation for one of four sets of phases.

Optionally, a first set of phases in the four set of phases covers 0 to 90 degrees semi-inclusive, a second set of phases in the four set of phases covers 90 and 180 degrees semi-inclusive, a third set of phases in the four set of phases covers 180 and 270 degrees semi-inclusive, and a fourth set of phases in the four set of phases covers 270 and 360 degrees semi-inclusive.

Further details of aspects, objects, and advantages of some embodiments are described below in the detailed description, drawings, and claims. Both the foregoing general description and the following detailed description are exemplary and explanatory, and are not intended to be limiting as to the scope of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only exemplary embodiments and are not therefore to be considered limiting in the scope of the claims.

DETAILED DESCRIPTION

Figure 1:
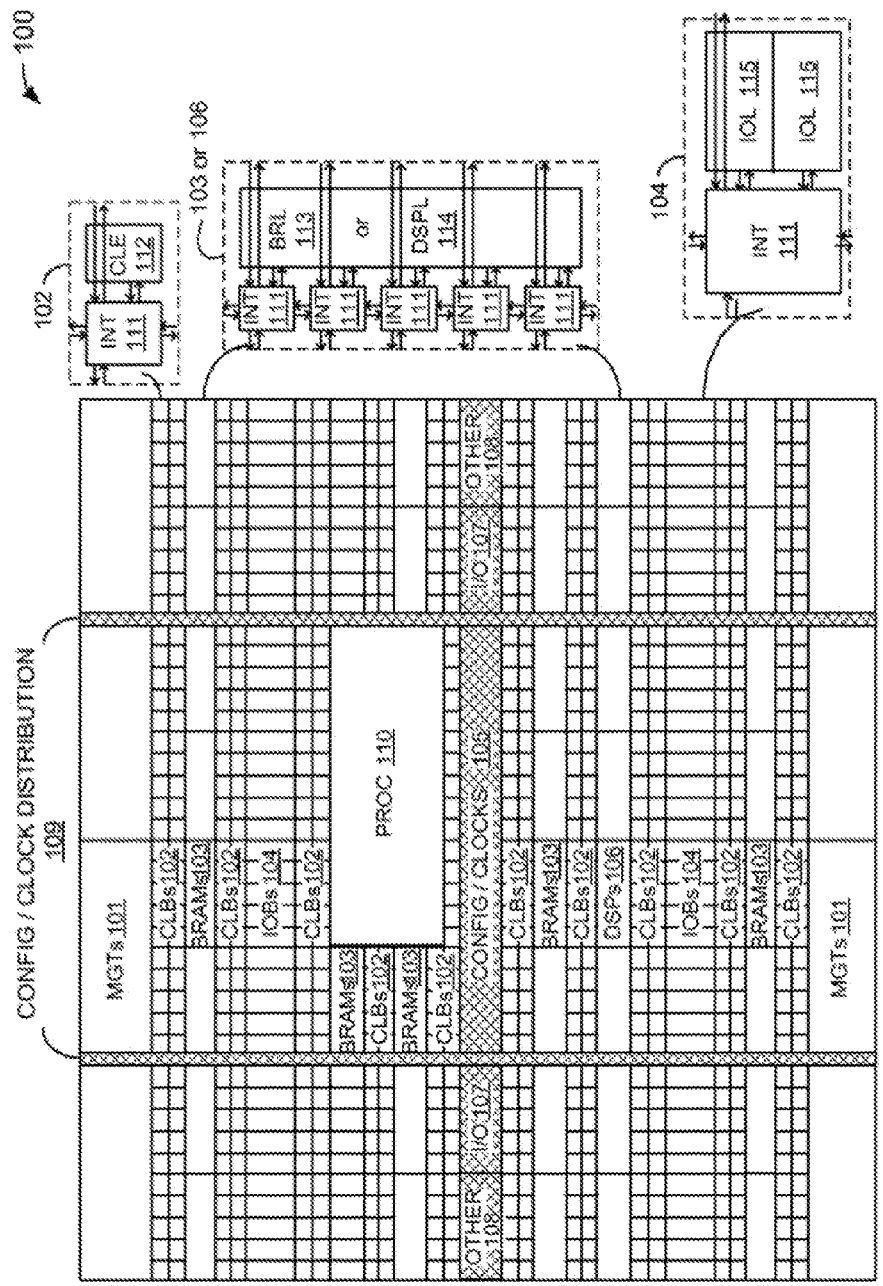
FIG. 1 is a simplified block diagram depicting an example of a Field Programmable Gate Array ("FPGA") architecture in which one or more aspects described herein may be implemented.

Various embodiments are described hereinafter with reference to the figures. It should be noted that the figures are not drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

FPGAs may include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108, such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distributed the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an example of FPGA architecture. For example, the numbers of logic blocks in a horizontal column, the relative width of the columns, the number and order of columns, the types of logic blocks included in the columns, the relative sizes of the logic blocks, and the interconnect/logic implementations included at the top of FIG. 1 are purely illustrative as examples. For example, in an actual FPGA more than one adjacent column of CLBs is typically included wherever the CLBs appear, to facilitate the efficient implementation of user logic, but the number of adjacent CLB columns varies with the overall size of the FPGA.

In the following description a phase interpolator is described, which may be implemented in whole or in part using programmable logic of an FPGA. However, for purposes of clarity, by way of example and not limitation, such phase interpolator is described as implemented with dedicated logic.

Figure 2:
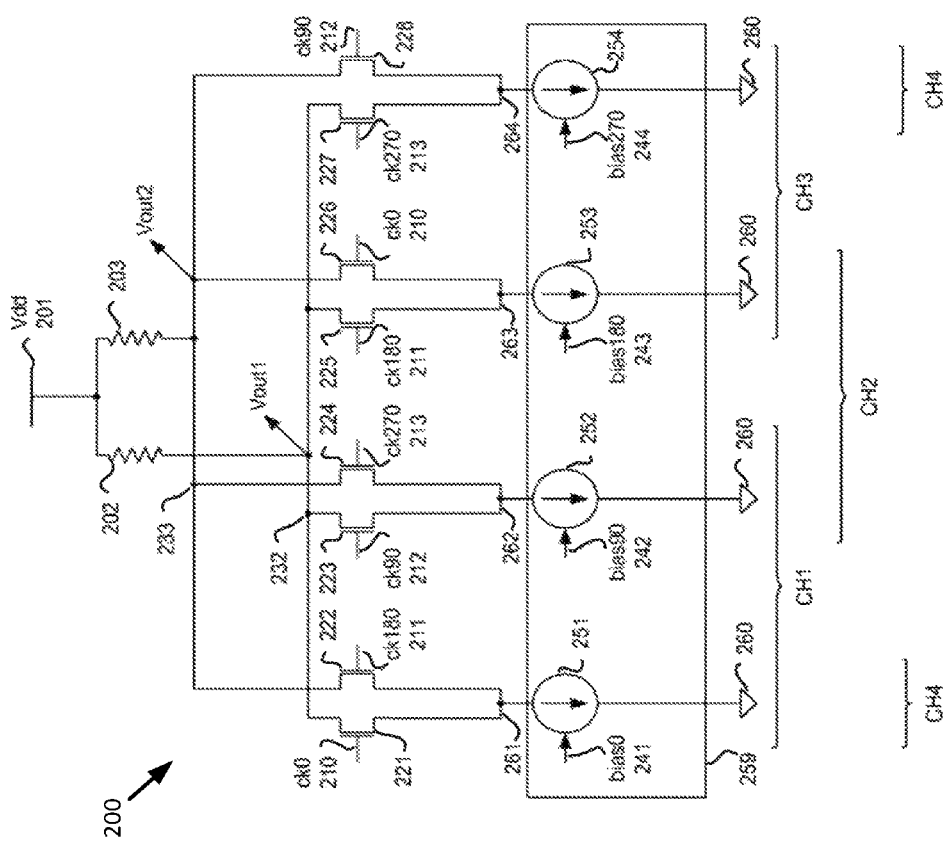
FIG. 2 is a circuit diagram depicting an example of a phase interpolation interface of a phase interpolator.

FIG. 2 is a circuit diagram illustrating a phase interpolation interface 200 of a phase interpolator, in accordance to some embodiments. A supply voltage, such as Vdd 201, is connected to a first resistance, such as resistor 202, and a second resistance, such as resistor 203. Even though resistors 202 and 203 are illustratively depicted for resistive loads, it should be understood that transistors, such as PMOS transistors, may be used to provide resistive loads.

For a CML driver implementation, resistors 202 and 203 may be configured for output resistances of an output CML buffer or driver, which for a CML implementation, each of the resistors is configured to provide a resistance that is at least approximately 50 ohms (e.g., 50 ohms±10 ohms), for example. In other examples, each of the resistors may provide a resistance that is more than 50 ohms, or less than 50 ohms. However, even though the following example is described for a CML driver implementation, it should be understood that any differential signal (e.g., differential pair) may be used.

Resistor 202 couples Vdd 201 to a supply-coupled node, such as output node 232, and resistor 203 couples Vdd 201 to another supply-coupled node, such as output node 233. An output voltage, such as Vout1, may be sourced from output node 232, and an output voltage, such as Vout2, may be sourced from output node 233. The difference in these output voltages may be associated with a selected phase provided from the phase interpolation interface 200.

The phase interpolation interface 200 includes multiple CML differential pairs buffers, which may be coupled to a single digital-to-analog converter ("DAC") of a phase interpolator, as described below. In this example, there are four differential pairs, which are generally indicated as channel 1 ("CH1"), channel 2 ("CH2"), channel 3 ("CH3"), and channel 4 ("CH4"). However, it should be understood that the number of channels may be fewer than four (e.g., two, three), or more than four. For example, in other cases, ten channels may be implemented.

In the illustrated example, the channel CH1 is for phase angle range 0 to 90 degrees, namely quadrant 1 of an x-y phase angle graph. The channel CH2 is for phase angle range 90 to 180 degrees, namely quadrant 2. The channel CH3 is for phase angle range 180 to 270 degrees, namely quadrant 3. The channel CH4 is for phase angle range 270 to 0 degrees, namely quadrant 4.

In the illustrated example shown in FIG. 2, there are two groups of transistors. One group of transistors, namely transistors 221, 223, 225, and 227, is coupled to the output node 232. The other group of transistors, namely transistors 222, 224, 226, and 228, is coupled to the output node 233. More particularly, a first source/drain node of each of transistors 221, 223, 225, and 227 is coupled to the output node 232, and a first source/drain node of each of transistors 222, 224, 226, and 228 is coupled to the output node 233.

Transistors 221-228 are coupled in pairs at second source/drain nodes thereof as follows. Second source/drain nodes of transistors 221 and 222 are coupled to current source node 261. Second source/drain nodes of transistors 223 and 224 are coupled to current source node 262. Second source/drain nodes of transistors 225 and 226 are coupled to current source node 263. Second source/drain nodes of transistors 227 and 228 are coupled to current source node 264. In this exemplary embodiment, NMOS transistors are depicted for transistors 221 through 228, and thus first source/drain nodes thereof are drain nodes and second source/drain nodes thereof are source nodes. However, in other cases, one or more of the transistors 221-228 may be implemented as PMOS transistor(s), or a combination of PMOS and NMOS transistors.

In the illustrated example, gates of transistor 221, 223, 225, and 227 are respectively coupled to receive a set of phases of a clock signal. Moreover, gates of transistors 222, 224, 226, and 228 are respectively coupled to receive the set of phases of the clock signal.

A 0-degree phase signal, such as a 0-degree phase clock ("ck0") signal 210, is provided to a gate of transistor 221, and a 180-degree phase signal, such as a 180-degree phase clock ("ck180") signal 211, is provided to a gate of transistor 222. A 90-degree phase signal, such as a 90-degree phase clock ("ck90") signal 212, is provided to a gate of transistor 223, and a 270-degree phase signal, such as a 270-degree phase clock ("ck270") signal 213, is provided to a gate of transistor 224. A 180-degree phase signal, such as ck180 signal 211, is provided to a gate of transistor 225, and a 0-degree phase signal, such as ck0 signal 210, is provided to a gate of transistor 226. A 270-degree phase signal, such as ck270 signal 213, is provided to a gate of transistor 227, and a 90-degree phase signal, such as ck90 signal 212, is provided to a gate of transistor 228.

It should be understood that even though a set of phase signals of 0, 90, 180, and 270 degrees is described, with each phase range being generally 90 degrees, in other cases, starting and ending phases and/or phase ranges other than these may be implemented. It should further be understood that ck0 signal 210 and ck180 signal 211 is one complementary pair of clock signals, and ck90 signal 212 and ck270 signal 213 is another pair of complementary clock signals. Thus, if ck0 signal 210 is logic high for example, then ck180 signal 211 is logic low, and vice versa. Likewise, if ck90 signal 212 is logic high, then ck270 signal 213 is logic low, and vice versa.

Accordingly, during operation, if transistor 221 is in a substantially conductive state (e.g., "ON" state), then transistor 222 is in a substantially nonconductive state (e.g., "OFF" state), and vice versa. Likewise, if transistor 223 is ON, then transistor 224 is OFF, and vice versa. Furthermore, if transistor 225 is ON, then transistor 226 is OFF, and vice versa. Lastly, if transistor 227 is ON, then transistor 228 is OFF, and vice versa.

In the illustrated example shown in FIG. 2, pairs of transistors 221/222 and 225/226 are coupled to receive 0 and 180-degree phase clock signals. Also, pairs of transistors 223/224 and 227/228 are coupled to receive 90 and 270-degree phase clock signals. The application of clock signal phase for each pair grouping is flipped from left to right as associated with different output nodes.

A current source network 259 is coupled between current source nodes 261-264 and ground 260. Current source network 259 may include current sources 251, 252, 253, 254, for implementing channels CH1-CH4. In particular, current sources 251, 252 are for channel CH1, current sources 252, 253 are for channel CH2, current sources 253, 254 are for channel CH3, and current sources 254, 251 are for channel CH4.

The current source 251 is coupled between current source node 261 and ground 260. A bias control ("bias") signal associated with a phase selection range, such as bias0 signal 241, is provided as an input to current source 251. A current source 252 is coupled between current source node 262 and ground 260. A bias signal associated with a phase selection range, such as bias90 signal 242, is provided as an input to current source 252. A current source 253 is coupled between current source node 263 and ground 260. A bias signal associated with a phase selection range, such as bias180 signal 243, is provided as an input to current source 253. A current source 254 is coupled between current source node 264 and ground 260. A bias signal associated with a phase selection range, such as bias270 signal 244, is provided as an input to current source 254.

In this illustrated embodiment, a phase selected to be between 0 and 90 degrees, namely in quadrant 1 of an x-y phase angle graph, means that bias0 signal 241 and bias90 signal 242 are asserted or maintained asserted for providing drive current and interpolation, while bias180 signal 243 and bias270 signal 244 are de-asserted and receive only bleeder current. As used here, asserted and de-asserted does not necessarily mean that the current sources are fully on or off. Rather, to interpolate between 0 and 90 degrees, bias0 signal 241 and bias90 signal 242 receive current in varying amounts to shift the phase one direction or another. For example, more current provided by bias0 signal 241 than bias90 signal 242 results in a output phase that is closer to ck0; meanwhile, bias180 signal 243 and bias270 signal 244 are de-asserted in that they are on standby and not actively interpolating the signal. Further, it is noted that though bleeder currents keep de-asserted transistors at a non-zero current value, all current sources—both asserted and de-asserted—may receive bleeder current, as is discussed in further detail below. In some cases, the assertion and de-assertion of signals may be implemented as a selection operation, such as that used for multiplexing. In this illustrated embodiment, a phase selected to be between 90 and 180 degrees, namely in quadrant 2 of an x-y phase angle graph, means that bias90 signal 242 and bias180 signal 243 are asserted or maintained asserted, and that bias0 signal 241 and bias270 signal 244 are de-asserted or maintained not asserted (e.g., receive only bleeder current). In this illustrated embodiment, a phase selected to be between 180 and 270 degrees, namely in quadrant 3 of an x-y phase angle graph, means that bias180 signal 243 and bias270 signal 244 are asserted or maintained asserted and that bias0 signal 241 and bias90 signal 242 are de-asserted or maintained not asserted. In this illustrated embodiment, a phase selected to be between 270 and 0 degrees, namely in quadrant 4 of an x-y phase angle graph, means that bias270 signal 244 and bias0 signal 241 are asserted or maintained asserted and that bias90 signal 242 and bias180 signal 243 are de-asserted or maintained not asserted. In this exemplary embodiment, each of the four phase ranges is semi-inclusive (e.g., non-overlapping), namely inclusive of the starting phase angle of such range and not inclusive of the ending phase angle of the range, as follows: [0, 90), [90, 180), [180, 270), and [270, 0).

It should be understood that for high-speed serial operation, tail currents are to be responsive. Thus to enhance speed of operation, current sources of unselected channels may be switched to a default bias but not off, as described below in additional detail.

Bias signals 241-244 may be configured to control whether current sources 251-254, respectively, are used for drive current or bleeder current. For example, a phase between 0 and 90 degrees may be selected after a previous phase angle selection between 180 and 270 degrees. In this example, bias0 signal 241 and bias90 signal 242 are for providing drive current, and bias180 signal 243 and bias270 signal are for providing bleeder current. Likewise, similar description is applicable to selection of any phase for any of the other quadrants, where bias signals associated with the range of a selected phase are asserted, and where bias signals not associated with the range of the selected phase are not asserted.

It should be understood that "bleeder" tail currents may be implemented by having non-zero default biases associated with unselected phases, and thus collectively there is a "bleed" current output shift or offset. Thus, as an example, a "bleed" current may be offset from zero current. The weight of bias signals in an unselected or standby state may vary from application-to-application, such as for example depending on how much standby or bleeder current may be tolerated, and how much delay in operation of current sources may be tolerated, etc. Thus, the amount of "bleed" current offset may vary from application-to-application. Bleed currents for some integrated circuit applications may generally be measured in microamperes.

Figure 3:
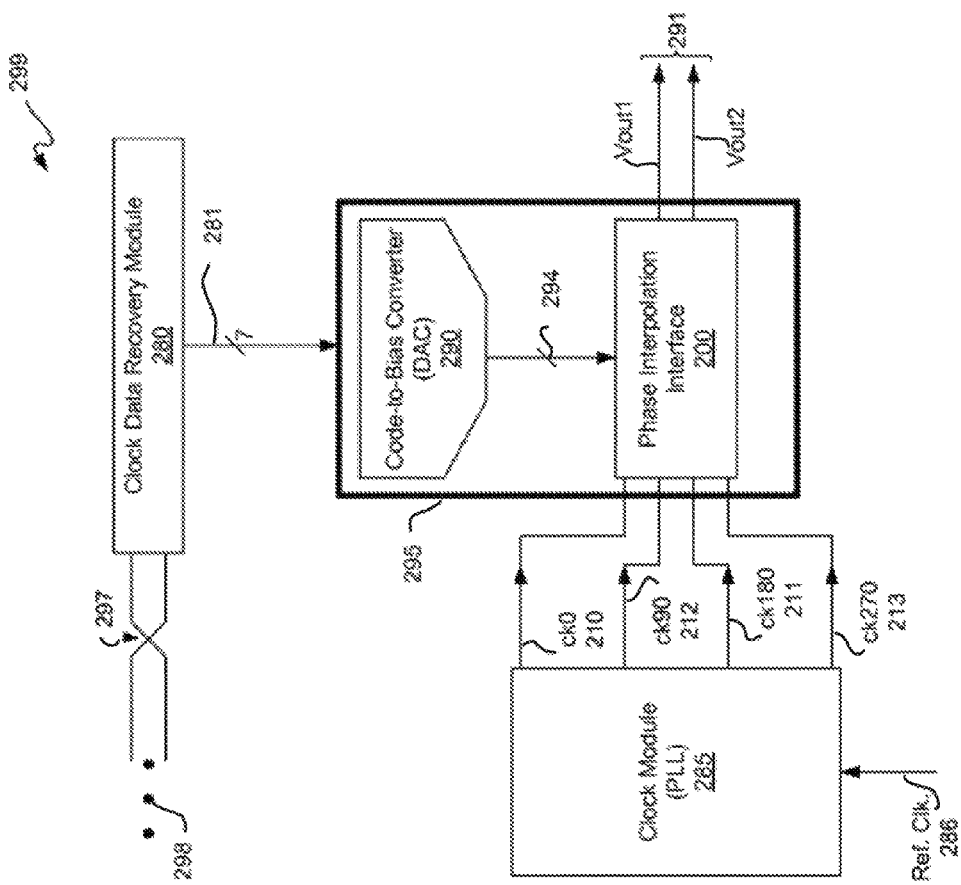
FIG. 3 is a block/circuit diagram depicting an example of a differential data receiver front end having a phase interpolator.

FIG. 3 is a block/circuit diagram illustrating an embodiment of a differential data receiver front end 299. Differential data receiver front end 299 includes clock data recovery ("CDR") module 280, phase interpolator 295, and clock module 285. With simultaneous reference to FIGS. 2 and 3, differential data receiver front end 299 is further described.

Clock module 285 may be implemented with a phase-lock-loop ("PLL"). PLL 285 receives a reference clock signal 286 and generates clock signals of different phases. In this exemplary embodiment, PLL 285 generates ck0 signal 210 at least generally at phase degree 0, ck90 signal 212 at least generally at phase degree 90, ck180 signal 211 at least generally at phase degree 180, and ck270 signal at least generally at phase degree 270. Clock signals 210, 211, 212, 213 are input to a phase interpolation interface 200 at the phase interpolator 295, as previously described with reference to FIG. 2.

During use, a stream 297 of differential data 298 is provided as input to the CDR module 280. The CDR module 280 may be implemented for producing a coded output, such as binary coded output 281. Optionally, CDR module 280 may be have the configuration described in U.S. Pat. No. 8,253,451, titled "Clock Data Recovery", by Cheng Hsiang Hsieh, et al., filed on Jun. 16, 2010, the entirety of which is expressly incorporated by reference herein for all purposes.

In this exemplary embodiment, a seven-bit binary code is used for binary coded output 281, namely for coding from 0 to 127 by increments of 1, which is output to phase interpolator 295. However, it should be understood that other codes and/or other bit lengths may be used. In this exemplary embodiment, values 0 to 31 of such binary code are for phases from 0 to 90 degrees semi-inclusive (i.e., one side only as previously described); values 32 to 63 of such binary code are for phases from 90 to 180 degrees semi-inclusive; values 64 to 95 of such binary code are for phases from 180 to 270 degrees semi-inclusive; and values 96 to 127 of such binary code are for phases from 270 to 0 degrees semi-inclusive.

A code-to-bias converter 290 at the phase interpolator 295 is coupled to receive the binary coded output 281, as described below in additional detail, and is configured to produce bleeder or current drive signals 294. Converter 290 may be implemented as a digital-to-analog converter ("DAC"). It should be understood that current drive signals 294 output from DAC 290 as described herein may be analog, while other signals described herein may be digital except for Vout1 and Vout2. Current drive signals 294 are provided from DAC 290 to phase interpolation interface 200, which provides output 291 (Vout1, Vout2). Optionally, control circuitry as described herein is incorporated as part of DAC 290 and phase interpolation interface 200. Additional optional details for implementing DAC module 290 and an embodiment for a phase interpolation interface are described in U.S. Pat. No. 8,184,029, titled "Phase Interpolator", by Cheng Hsiang Hsieh, et al., filed on Jun. 16, 2010, the entirety of which is expressly incorporated by reference herein for all purposes.

In one embodiment, code-to-bias converter 290 may be implemented as a thermometer encoded DAC, having column decoders and row decoders that select a cell from one or more matrices, where the cell is selected in response to the binary coded output 281. The selected cell may set how many drive transistors should be "on" within a current source. The current source, in some embodiments, comprises a plurality of transistors that, when set high/low, output control current source voltages. The control current source voltages may be input into a one or more pass gates (e.g., multiplexers), which can select different values to shift a phase angle within a given phase range (e.g., shifting phase in the range between 0 to 90 degrees).

One drawback of some approaches occurs when multiplexers in a phase interpolator switch from one phase range to another phase range; that is, across a boundary (e.g., from 0 to 90 degrees, to 90 to 180 degrees). When switching across a boundary, transistors in the current sources may become mismatched as they are de-coupled and coupled to new transistors with different physical characteristics. This issue, sometimes referred to as "device mismatch", may occur because of process variation (e.g., variations in the manufacturing of the transistors or other IC components), which creates transistors that are intended to have the same properties, but when implemented in a circuit, exhibit statistical differences in behavior. In the case of phase interpolation, device mismatch may occur when coupling a transistor that (used to receive only bleeder current) is now driven high (e.g., asserted) to receive bias current and bleeder current, and vice versa, for example. In phase interpolation devices, device mismatch at the quadrant boundaries may become particularly troublesome and often results in poor statistical DNL near or around the quadrant boundaries.

Figure 4:
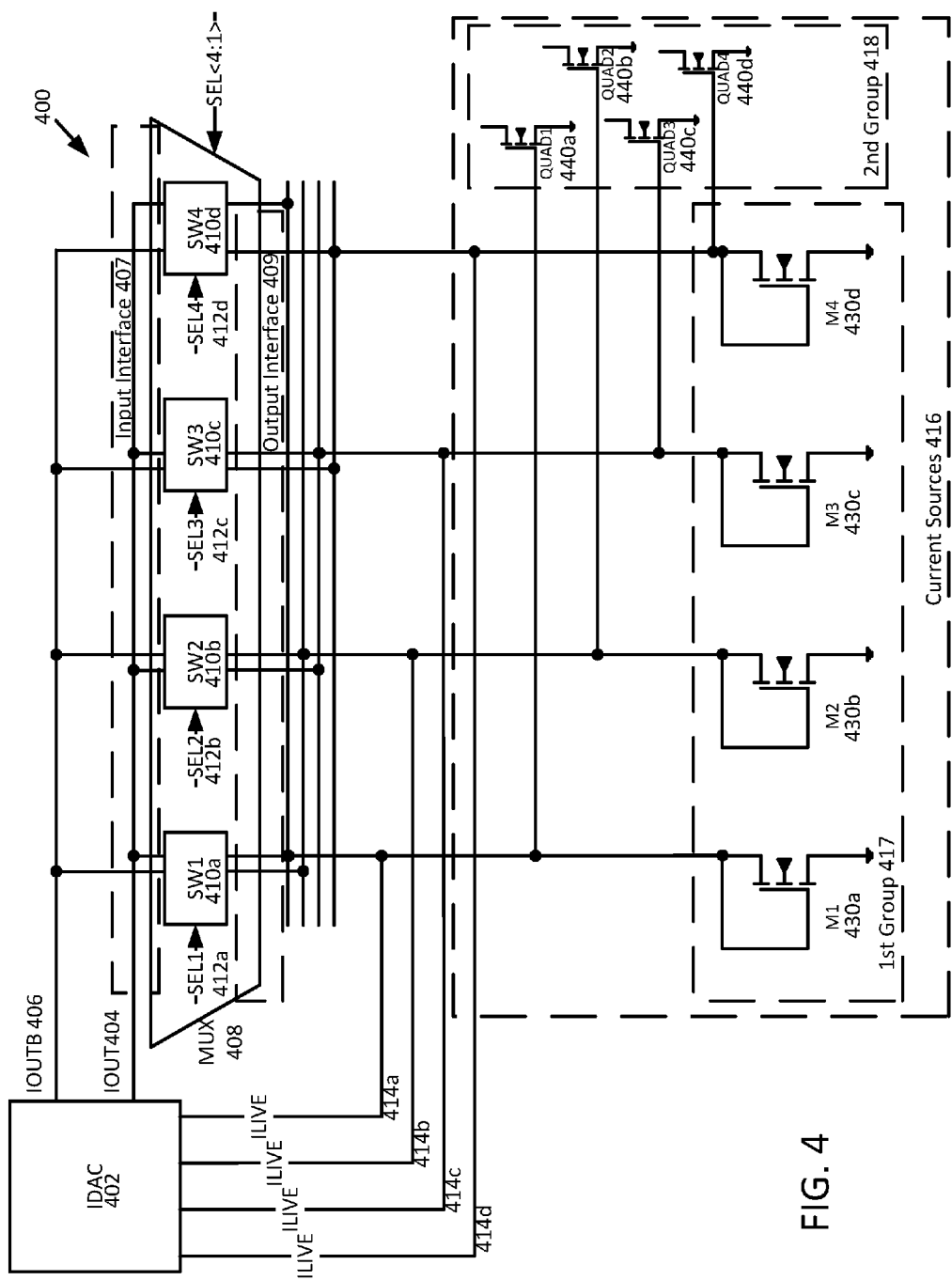
FIG. 4 is a block/circuit diagram depicting an example of control circuitry of the phase interpolator of FIG. 3.

FIG. 4 is a block/circuit diagram illustrating an improved phase interpolator 400 with improved performance at quadrant boundaries, in accordance to some embodiments. The phase interpolator 400 may be implemented into the configurations of FIGS. 1-3. For example, as phase interpolator 295 in FIG. 3. With simultaneous reference to FIGS. 1-4, the improved phase interpolator 400 is further discussed.

A current mode DAC 402 may receive the binary input coded output 281 and convert the coded output into bias currents IOUT 404 and IOUTB 406. The bias currents IOUT 404 and IOUTB 406 may directly input into a pass gate, such as multiplexer 408. As illustrated, multiplexer 408 has an input interface 407, through which one or more bias currents may be input, and an output interface 409, from which current control source voltage signals may emanate. Though a single multiplexer is illustrated, other configurations, such as other types of pass gates or data selectors may be used. Similarly, multiple pass gates may be used, as opposed to the example single multiplexer 408. As illustrated, multiplexer 408 may comprise a plurality of switches SW1 410a, SW2 410b, SW3 410c, SW4 410d (collectively, SW1-SW4), and corresponding selector controls SEL1 412a, SEL2 412b, SEL3 412C, SEL4 412D (collectively, SEL <4:1>), that activate or de-activate their respective switches.

As illustrated, the current mode DAC 402 may further function as a bleeder current source that generates a plurality of bleeder current signals 414a-414d (ILIVE). In some cases, the DAC 402 may include a bleeder current source for generating the bleeder current signals 414a-414d. The bleeder current signals 414a-d may couple to current sources 416 as well as to output interface 409 (and the control voltages emanating therefrom). Notably, in contrast to past approaches, the bleeder current signals 414a-414d bypass the multiplexer, and instead are directly coupled to the current sources 416. As discussed above, each bleeder current signal 414 keeps transistors in the non-asserted current sources at a non-zero current value, so that they are not turned off all the way, but retain small amounts of charge so that the transistors can be more quickly transitioned to a logic high state as needed.

In accordance to some embodiments, the current sources 416 comprise a plurality of transistors which may function as current mirrors for different bias signals. Transistors 430a-430d in the first group 417 of transistors may each have a first source/drain coupled to ground, a second source/drain coupled to the output interface 409 (e.g., to receive current control source voltages from the output interface 409), and a gate coupled to the source voltage. Transistors 440a-440d in a second group 418 of transistors may each have a first source/drain coupled to ground, a second source/drain node coupled to a respective current source node (such as any of the current source nodes 261-264 described with reference to FIG. 2), and a gate coupled with a first source/drain in a respective one of the transistors 430 to form fixed transistor pairs with their corresponding transistors 430a-430d (from the first group 417 of transistors). In particular, the transistors 430a, 440a form a first fixed transistor pair for the first current source in the plurality of current sources 416. Transistors 430b, 440b form a second fixed transistor pair for the second current source in the plurality of current sources 416. Transistors 430c, 440c form a third fixed transistor pair for the third current source in the plurality of current sources 416. Transistors 430d, 440d form a fourth fixed transistor pair for the fourth current source in the plurality of current sources 416. In some embodiments, the transistors 430a-430d, 440a-440d may be implemented as NMOS types, though other configurations using other types of transistors may also be implemented (e.g., PMOS transistors, combinations of PMOS/NMOS).

To form current sources, transistors from each group may be coupled as a current mirror. For example, a first current source may include the transistor M1 430a and transistor QUAD1 440a, a second current source may include the transistor M2 430b and transistor QUAD2 440b, a third current source may include the transistor M3 430c and transistor QUAD3 440c, and a fourth current source may include the transistor M4 430d and transistor QUAD4 440d. Pairs of the current sources may be used to interpolate clock signals within a range of phase angles. In the illustrated example, the first channel having a phase range between 0 and 90 degrees is managed by the first current source (transistors M1, QUAD1) and the second current source (transistors M2, QUAD2). The second channel having a phase range between 90 and 180 degrees is managed by the second current source (transistors M2, QUAD2) and the third current source (transistors M3, QUAD3). The third channel having a phase range between 180 and 270 degrees is managed by the third current source (transistors M3, QUAD3) and the fourth current source (transistors M4, QUAD4), and the fourth channel having a range between 270 and 360 degrees is managed by the first current source (transistors M1, QUAD1) and the fourth current source (transistors M4, QUAD4).

As illustrated above, the first current source, the second current source, the third current source, and the fourth current source have respective fixed transistor pairs. During use, the first current source and the second current source are configured to interpolate a phase angle in the first set of phases (e.g., 0 to 90 degrees semi-inclusive), the second current source and the third current source are configured to interpolate a phase angle in the second set of phases (e.g., 90 to 180 degrees semi-inclusive), wherein the third current source and the fourth current source are configured to interpolate a phase angle in the third set of phases 9 e.g., 180 to 270 degrees semi-inclusive), and wherein the first current source and the fourth current source are configured to interpolate a phase angle in the fourth set of phases (e.g., 270 to 360 degrees semi-inclusive).

As shown in the figure, the DAC (bleeder current source) 402 is coupled to the transistors 430a-430d of the respective current sources 416 via respective conductors, which are configured to transmit bleeder current signals 414a-414d, respectively, to the current sources 416. Accordingly, the bleeder current signals 414a-414d bypass the multiplexer 408, and are transmitted to the respective current sources 416 without going through the multiplexer 408.

Figure 5:
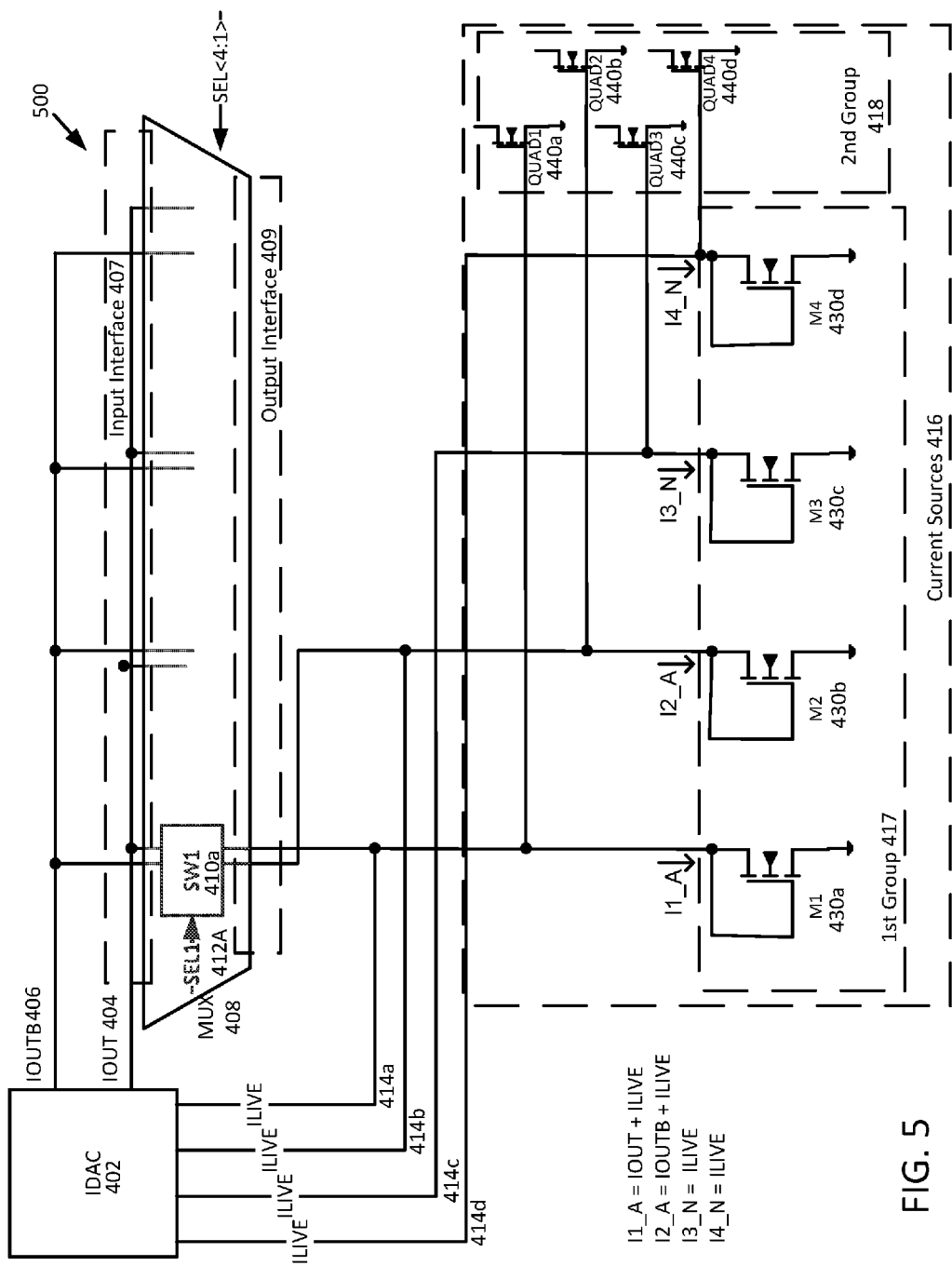
FIG. 5 is a block/circuit diagram depicting an example of control circuitry of the phase interpolator of FIG. 3 in a first configuration.
Figure 6:
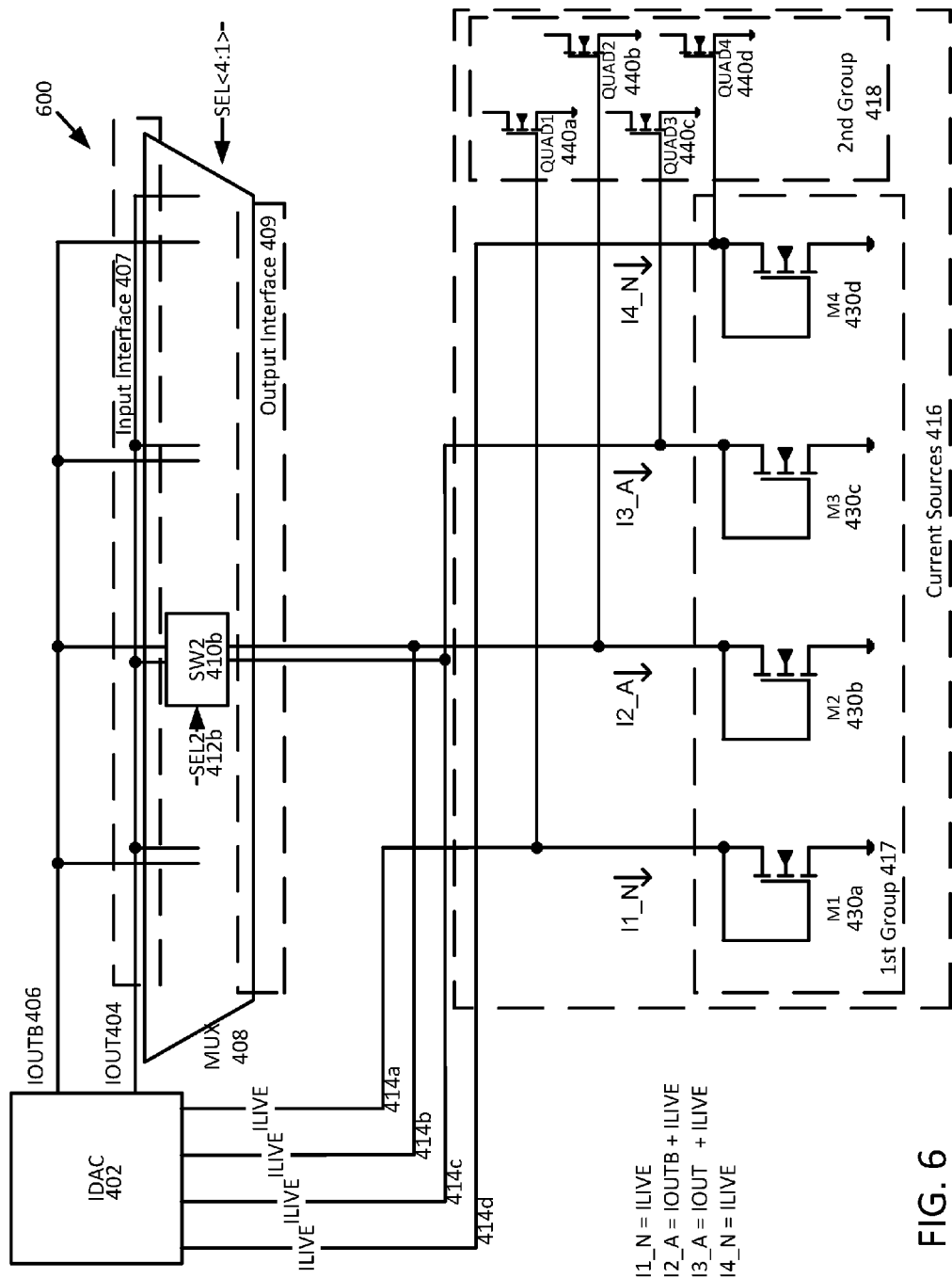
FIG. 6 is a block/circuit diagram depicting an example of control circuitry of the phase interpolator of FIG. 3 in a second configuration.

FIGS. 5 and 6 show an example of switching from a first phase range from 0 to 90 degrees, to a second phase range from 90 to 180 degrees. With reference to FIG. 5 which shows the phase interpolator in a first configuration 500, the DAC 402 receives a first phase interpolation (PI) code for the first phase range interpolation. As such, only one switch, SW1 410a, is selected using control selector SEL1 in multiplexer 408. In response to the first PI code, DAC 402 converts the PI code and outputs bias currents IOUT 404 and IOUTB 406 into SW1 410a. In response to the bias currents, the switch SW1 410a provides control current source voltages, which are voltages for controlling the current sources 416. In particular, control current source voltages from the switch SW1 410a are input into transistor M1 430a (which causes the current to mirror at QUAD1 transistor 440a), and input into transistor M2 430b (which causes the corresponding current to mirror at the QUAD2 transistor 440b). Accordingly, the first current source 416 (with transistors M1, QUAD1) and the second current source 416 (with transistors M2, QUAD2) are active, while the third and fourth current sources 416 (with transistors M3, QUAD3 and transistors M4, QUAD4, respectively) and inactive and receive only bleeder currents from the bleeder current source (the DAC) 402 without any control current source voltages from the multiplexer 408. The active current sources 416 generate a differential signal that corresponds to a phase angle to be interpolated, the differential signal comprising a first output voltage signal from the first current source 416 and a second output voltage signal from the second current source 416.

Generally, the four current sources (having M1-M4 respectively) receive combinations bleeder current and bias currents, depending on whether a given current source is being actively used for interpolation (e.g., asserted) or on standby. In the example shown in FIGS. 5, M1 and M2 receive bias currents in addition to bleeder current. As illustrated in FIG. 5, the current to M1 is denoted by I1_A, where "A" represents the corresponding current source is active/asserted. The value of the current I1_A is equal to the bleeder current ILIVE 414A value and the bias current IOUT 404 value. Similarly, the M2 is also active/asserted and the current input into current to is I2_A. The value of the current I2_A is equal to the bleeder current ILIVE 414B value and the bias current IOUTB 406 value. In contrast, the currents to M3 and M4, which correspond to de-asserted current sources, are represented by I3_N and I4_N, respectively (where "N" represents that the corresponding current source is de-asserted). The value of both I3_N and I4_N is the value of their respective bleeder current values, i.e., ILIVE 414C and ILIVE 414D, respectively in the illustrated example.

Referring now to FIG. 6 which shows the phase interpolator in a second configuration 600. When DAC 402 receives a second PI code to switch to the second phase range (from 90 to 180 degrees), the control selector SEL2 may turn on SW2 and keep the rest of the switches off. As a result, control current source voltages are input into M2 (which causes the current to mirror at QUAD2 transistor) and input into M3 (which causes the corresponding current to mirror at the QUAD3 transistor). As such, in this configuration, the second current source (M2/QUAD2) and the third current source (M3/QUAD3) are active so that they receive bias currents and bleeder current, while the first and fourth current sources (M1/QUAD1 and M4/QUAD4, respectively) receive only bleeder currents from the bleeder current source (DAC 402, in this example) and do not receive bias currents. As illustrated in FIG. 6, the current to M2 is denoted by I2_A. The value of the current I2_A is equal to the bleeder current ILIVE 414B value and the bias current IOUTB 406 value. Similarly, the M3 is also active/asserted and its current input is I3_A. The value of the current I3_A is equal to the bleeder current ILIVE 414C value and the bias current IOUT 404 value. In contrast, the currents to M1 and M4, which correspond to de-asserted current sources, are represented by I1_N and I4_N, respectively. The value of both I1_N and I4_N is the value of their respective bleeder current values, ILIVE 414A and ILIVE 414D, respectively, in the illustrated example.

The switching from second phase range (90 to 180 degrees) to third phase range (180 to 270 degrees), and the switching from the third phase range to fourth phase range (270 degrees to 360 degrees), are similar to that described.

In contrast to past approaches, when switching between ranges, the pairing between transistors is pre-fixed. That is, the first, second, third, and fourth transistor pairs are not interchanged as the phase range is switched (e.g., M2/QUAD2 remain paired whether in channel CH1 or channel CH2). Thus, instead of switching bleeder currents to different transistors when quadrants are changed, the embodiments described herein provide fixed bleeder currents to transistor pairing. This allows the characteristics of the paired transistors to become more stable as each transistor in each pair receives the same bleeder signal and/or the same high (e.g., drive) signal simultaneously. Thus, device mismatch is avoided and improved statistical DNL can be achieved.

Figure 7:
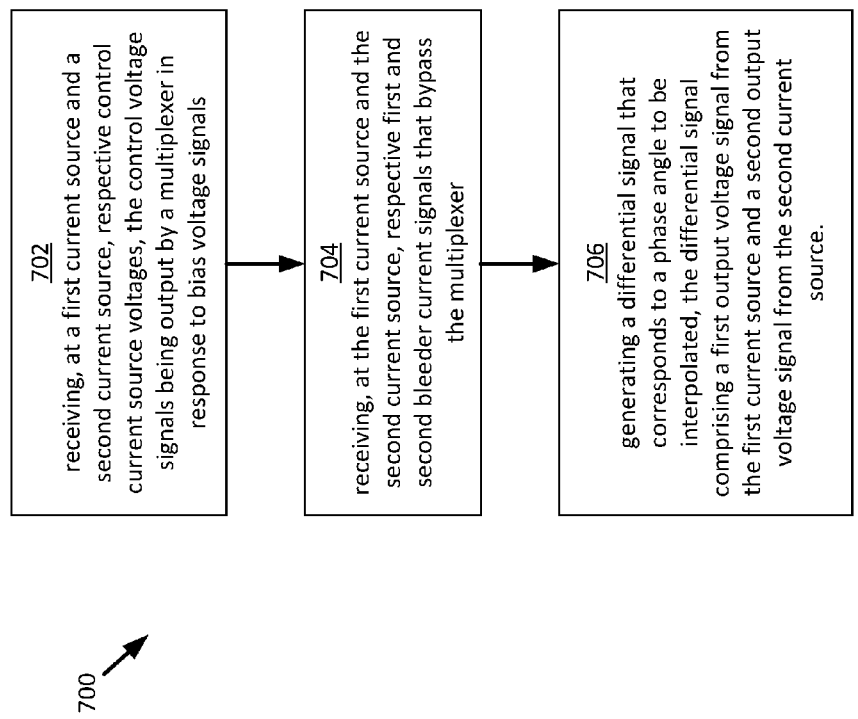
FIG. 7 shows a method for implementing an improved phase interpolation.

FIG. 7 illustrates a method 700 for implementing an improved phase interpolation. The method 700 includes: receiving, at a first current source and a second current source, respective control current source voltages, the control voltage signals being output by a multiplexer in response to bias voltage signals (item 702). The method 700 also includes receiving, at the first current source and the second current source, respective first and second bleeder current signals that bypass the multiplexer (item 704). The method 700 further includes generating a differential signal that corresponds to a phase angle to be interpolated, the differential signal comprising a first output voltage signal from the first current source and a second output voltage signal from the second current source (item 706).

Optionally, the method 700 may further include receiving, at a third current source and a fourth current source, respective third and fourth bleeder current signals that bypass the multiplexer.

Optionally, when the multiplexer outputs the control voltage signals for the first and second current sources, the multiplexer does not output any control voltage signals for the third and fourth current sources.

Optionally, when the multiplexer outputs control voltage signals for the second and third current sources, the multiplexer does not output any control voltage signals for the first and fourth current sources; wherein when the multiplexer outputs the control voltage signals for the third and fourth current sources, the multiplexer does not output any control voltage signals for the first and second current sources; and wherein when the multiplexer outputs the control voltage signals for the first and fourth current sources, the multiplexer does not output any control voltage signals for the second and third current sources.

Optionally, only two of the first, second, third, and fourth current sources are active at a time to provide phase angle interpolation for one of four sets of phases.

Optionally, a first set of phases in the four set of phases covers 0 to 90 degrees semi-inclusive, a second set of phases in the four set of phases covers 90 and 180 degrees semi-inclusive, a third set of phases in the four set of phases covers 180 and 270 degrees semi-inclusive, and a fourth set of phases in the four set of phases covers 270 and 360 degrees semi-inclusive.

In the above embodiments, four bleeder current signals 414*a*-414*d* are described. In other embodiments, the number of bleeder current signals may be fewer than four (e.g., two, three), or more than four. Similarly, in other embodiments, instead of having four switches 410*a*-410*d*, there may be fewer than four switches (e.g., two, three), or more than four switches in the multiplexer 408. Also similarly, in other embodiments, instead of having four current sources 416, there may be fewer than four current sources 416, or more than four current sources 416. Furthermore, each of the phase ranges corresponding to the four switches 410*a*-410*d* does not need to have a 90 degrees range, and may have other range values in other embodiments. For example, if the multiplexer 408 has 10 switches 410, then each corresponding phase range will be 360 degrees/10=36 degrees. In general, each phase range is 360 degrees/number of switches 410 in the multiplexer 408.

It should be noted that "first", "second", "third", "fourth", etc., or any of other similar terms, as used in this specification, is used to refer to different or separate items, and does not necessarily refer to order of items. For example "first current source" and "second current source" are used to refer to two current sources.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A phase interpolator, comprising:
   a digital-to-analog converter to generate bias signals associated with phase signals;
   a multiplexer having an input interface and an output interface, wherein the digital-to-analog converter is coupled to the input interface of the multiplexer;
   a first current source; and
   a second current source;

wherein the digital-to-analog converter is configured to provide bleeder current signals to the first current source and the second current source while bypassing the multiplexer.

2. The phase interpolator of claim 1, wherein the first current source and the second current source are coupled to the output interface of the multiplexer to receive control current source voltages.

3. The phase interpolator of claim 2, wherein the first current source includes:
 a first transistor having first source/drain nodes coupled to the output interface of the multiplexer; and
 a second transistor having a gate coupled to the source/drain node of the first transistor.

4. The phase interpolator of claim 3, wherein the first transistor and the second transistor form a fixed transistor pair.

5. The phase interpolator of claim 3, wherein the second transistor has a first source/drain node that is coupled to ground.

6. The phase interpolator of claim 5, wherein the second transistor has a second source/drain node that is coupled to a current source node.

7. The phase interpolator of claim 3, wherein the phase signals comprise a first range of phases, and a second range of phases, wherein the first range of phases and the second range of phases are non-overlapping.

8. The phase interpolator of claim 7, wherein the first current source is associated with the first range of phases and the second current source is associated with the second range of phases.

9. The phase interpolator of claim 1, wherein the first current source and the second current source are configured to receive respective outputs from the output interface of the multiplexer and to receive the bleeder current signals when the first current source and the second current source are active, and wherein the first current source and the second current source are configured to receive the bleeder current signals without the outputs from the output interface of the multiplexer when the first current source and the second current source are inactive.

10. The phase interpolator of claim 1, further comprising:
 a third current source; and
 a fourth current source;
 wherein the digital-to-analog converter is coupled to the third current source and the fourth current source.

11. The phase interpolator of claim 10, wherein the multiplexer comprises:
 a first switch that corresponds to a first set of phases that covers 0 to 90 degrees semi-inclusive,
 a second switch that corresponds to a second set of phases that covers 90 and 180 degrees semi-inclusive,
 a third switch the corresponds to a third set of phases that covers 180 and 270 degrees semi-inclusive, and
 a fourth switch that corresponds to a fourth set of phases that covers 270 and 360 degrees semi-inclusive.

12. The phase interpolator of claim 11, wherein first current source and the second current source are configured to interpolate a phase angle in the first set of phases, the second current source and the third current source are configured to interpolate a phase angle in the second set of phases, wherein the third current source and the fourth current source are configured to interpolate a phase angle in the third set of phases, and wherein the first current source and the fourth current source are configured to interpolate a phase angle in the fourth set of phases.

13. The phase interpolator of claim 12, wherein the first current source, the second current source, the third current source, and the fourth current source have respective fixed transistor pairs.

14. The phase interpolator of claim 1, wherein one of the bleeder currents is for keeping a transistor in the first current source in a non-zero current state.

15. A method for phase interpolation, comprising:
 receiving, at a first current source and a second current source, respective control current source voltages, the control voltage signals being output by a multiplexer in response to bias voltage signals;
 receiving, at the first current source and the second current source, respective first and second bleeder current signals that bypass the multiplexer; and
 generating a differential signal that corresponds to a phase angle to be interpolated, the differential signal comprising a first output voltage signal from the first current source and a second output voltage signal from the second current source.

16. The method of claim 15, further comprising receiving, at a third current source and a fourth current source, respective third and fourth bleeder current signals that bypass the multiplexer.

17. The method of claim 16, wherein when the multiplexer outputs the control voltage signals for the first and second current sources, the multiplexer does not output any control voltage signals for the third and fourth current sources.

18. The method of claim 17, wherein when the multiplexer outputs control voltage signals for the second and third current sources, the multiplexer does not output any control voltage signals for the first and fourth current sources;
 wherein when the multiplexer outputs the control voltage signals for the third and fourth current sources, the multiplexer does not output any control voltage signals for the first and second current sources; and
 wherein when the multiplexer outputs the control voltage signals for the first and fourth current sources, the multiplexer does not output any control voltage signals for the second and third current sources.

19. The method of claim 16, wherein only two of the first, second, third, and fourth current sources are active at a time to provide phase angle interpolation for one of four sets of phases.

20. The method of claim 19, wherein:
 a first set of phases in the four set of phases covers 0 to 90 degrees semi-inclusive,
 a second set of phases in the four set of phases covers 90 and 180 degrees semi-inclusive,
 a third set of phases in the four set of phases covers 180 and 270 degrees semi-inclusive, and
 a fourth set of phases in the four set of phases covers 270 and 360 degrees semi-inclusive.

* * * * *